(12) United States Patent
Hall et al.

(10) Patent No.: US 11,296,005 B2
(45) Date of Patent: Apr. 5, 2022

(54) INTEGRATED DEVICE PACKAGE INCLUDING THERMALLY CONDUCTIVE ELEMENT AND METHOD OF MANUFACTURING SAME

(71) Applicant: Analog Devices, Inc., Norwood, MA (US)

(72) Inventors: Brian Hall, North Andover, MA (US); David Frank Bolognia, Charlestown, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/580,655

(22) Filed: Sep. 24, 2019

(65) Prior Publication Data

US 2021/0090970 A1 Mar. 25, 2021

(51) Int. Cl.
*H01L 23/367* (2006.01)
*H01L 23/00* (2006.01)
(Continued)

(52) U.S. Cl.
CPC .......... *H01L 23/367* (2013.01); *H01L 21/563* (2013.01); *H01L 21/565* (2013.01);
(Continued)

(58) Field of Classification Search
CPC ................ H01L 23/367; H01L 23/481; H01L 23/49575; H01L 23/552; H01L 23/4224; H01L 23/3677; H01L 23/49827; H01L 25/0657; H01L 25/03; H01L 21/563; H01L 21/565; H01L 24/20; H01L 2924/181;
(Continued)

(56) References Cited

U.S. PATENT DOCUMENTS 4,303,934 A 12/1981 Stitt
5,247,597 A 9/1993 Blacha et al.
(Continued)

OTHER PUBLICATIONS

Possum™ Die Design as a Low Cost 3D Packaging Alternative, accessed Jul. 26, 2019.
(Continued)

*Primary Examiner* — Khiem D Nguyen
(74) *Attorney, Agent, or Firm* — Knobbe Martens Olson & Bear LLP

(57) ABSTRACT

An integrated device package is disclosed. The integrated device package can include a substrate that has an upper side and a lower side opposite the upper side. The integrated device package can include an integrated device die that is mounted to the lower side of the substrate. The integrated device die has a first side facing the lower side of the substrate and a second side opposite the first side. The package can include a molding material in which the integrated device die is at least partially embedded. The package can include a thermally conductive element coupled to the second side of the integrated device die. At least a portion of the thermally conductive element can be exposed through the molding material. The thermally conductive element can be a heat sink. The package can include an interconnect that is configured to provide an external connection. The interconnect extends at least partially through the molding material from the lower side of the substrate.

20 Claims, 11 Drawing Sheets

(51) Int. Cl.
*H01L 21/56* (2006.01)
*H01L 23/66* (2006.01)
*H01L 23/48* (2006.01)

(52) U.S. Cl.
CPC ............ *H01L 23/481* (2013.01); *H01L 23/66* (2013.01); *H01L 24/17* (2013.01); *H01L 2223/6677* (2013.01); *H01L 2924/15311* (2013.01); *H01L 2924/15313* (2013.01)

(58) Field of Classification Search
CPC . H01L 2924/15311; H01L 2225/06517; H01L 2225/1058; H01L 23/36; H01L 23/3672; H01L 23/3675; H01L 23/373; H01L 21/56; H01L 24/17; H01L 24/18; H01L 23/38; H01L 23/40; H01L 23/42; H01L 23/46; H01L 23/66; H01L 23/3128; H01L 23/4334; H01L 21/4871; H01L 2924/15313; H01L 2924/15321; H01L 2224/12105; H01L 2224/73259; H01L 27/17; H01L 27/18; H01L 2223/6677
USPC ........................................................ 257/713
See application file for complete search history.

(56) References Cited

U.S. PATENT DOCUMENTS

| | | | |
|---|---|---|---|
| 5,293,069 A | 3/1994 | Kato et al. | |
| 5,689,091 A | 11/1997 | Hamzehdoost et al. | |
| 6,150,725 A | 11/2000 | Wenzel et al. | |
| 6,282,095 B1* | 8/2001 | Houghton | H01L 23/3675 165/80.2 |
| 6,326,611 B1 | 12/2001 | Kennedy et al. | |
| 6,388,336 B1 | 5/2002 | Venkateshwaran et al. | |
| 6,441,475 B2 | 8/2002 | Zandman et al. | |
| 6,489,686 B2 | 12/2002 | Farooq et al. | |
| 6,490,161 B1 | 12/2002 | Johnson | |
| 6,657,311 B1 | 12/2003 | Hortaleza et al. | |
| 6,723,585 B1 | 4/2004 | Tu et al. | |
| 6,777,789 B1 | 8/2004 | Glenn et al. | |
| 6,787,916 B2 | 9/2004 | Halahan | |
| 6,815,829 B2 | 11/2004 | Shibata | |
| 6,821,817 B1 | 11/2004 | Thamby et al. | |
| 6,825,108 B2* | 11/2004 | Khan | H01L 21/4857 257/734 |
| 6,921,968 B2* | 7/2005 | Chung | H01L 21/563 257/686 |
| 7,196,411 B2 | 3/2007 | Chang | |
| 7,209,362 B2 | 4/2007 | Bando | |
| 7,217,994 B2 | 5/2007 | Xiaoqi et al. | |
| 7,224,058 B2* | 5/2007 | Fernandez | H01L 23/13 257/707 |
| 7,249,752 B1 | 7/2007 | Foley et al. | |
| 7,408,244 B2 | 8/2008 | Lee et al. | |
| 7,411,281 B2 | 8/2008 | Zhang | |
| 7,489,025 B2 | 2/2009 | Chen et al. | |
| 7,541,644 B2 | 6/2009 | Hirano et al. | |
| 7,619,303 B2 | 11/2009 | Bayan | |
| 7,745,927 B2 | 6/2010 | Ryan et al. | |
| 7,858,437 B2 | 12/2010 | Jung et al. | |
| 7,911,059 B2 | 3/2011 | Cheng et al. | |
| 7,998,791 B2 | 8/2011 | Chong et al. | |
| 8,080,925 B2 | 12/2011 | Berger et al. | |
| 8,115,307 B2 | 2/2012 | Toyama et al. | |
| 8,284,561 B2* | 10/2012 | Su | H05K 1/186 361/761 |
| 8,399,994 B2 | 3/2013 | Roh et al. | |
| 8,653,635 B2 | 2/2014 | Gowda et al. | |
| 8,842,951 B2 | 9/2014 | Doscher et al. | |
| 9,156,673 B2 | 10/2015 | Bryzek et al. | |
| 9,195,055 B2 | 11/2015 | Oberst et al. | |
| 9,240,394 B1* | 1/2016 | Ben Jamaa | H01L 24/17 |
| 10,121,766 B2 | 11/2018 | Monroe | |
| 10,121,768 B2 | 11/2018 | Lin et al. | |
| 10,651,109 B2* | 5/2020 | Abd Hamid | H01L 23/3736 |
| 2002/0090749 A1 | 7/2002 | Simmons et al. | |
| 2003/0104651 A1 | 6/2003 | Kim et al. | |
| 2004/0007750 A1 | 1/2004 | Anderson et al. | |
| 2005/0046003 A1 | 3/2005 | Tsai | |
| 2005/0101161 A1 | 5/2005 | Weiblen et al. | |
| 2005/0104196 A1 | 5/2005 | Kashiwazaki | |
| 2005/0285239 A1 | 12/2005 | Tsai et al. | |
| 2006/0138622 A1 | 6/2006 | Lu et al. | |
| 2006/0261453 A1 | 11/2006 | Lee et al. | |
| 2008/0157344 A1* | 7/2008 | Chen | H01L 23/4334 257/706 |
| 2008/0290502 A1 | 11/2008 | Kutlu | |
| 2008/0315390 A1 | 12/2008 | Kuhmann et al. | |
| 2009/0032926 A1 | 2/2009 | Sharifi | |
| 2009/0070727 A1 | 3/2009 | Solomon | |
| 2009/0282917 A1 | 11/2009 | Acar | |
| 2010/0019393 A1 | 1/2010 | Hsieh et al. | |
| 2010/0133629 A1 | 6/2010 | Zhang et al. | |
| 2010/0187557 A1 | 7/2010 | Samoilov et al. | |
| 2010/0200998 A1 | 8/2010 | Furuta et al. | |
| 2010/0244217 A1 | 9/2010 | Ha et al. | |
| 2011/0024899 A1 | 2/2011 | Masumoto et al. | |
| 2011/0062572 A1 | 3/2011 | Steijer et al. | |
| 2011/0133847 A1 | 6/2011 | Ogura et al. | |
| 2012/0027234 A1 | 2/2012 | Goida | |
| 2012/0241925 A1 | 9/2012 | Yoon et al. | |
| 2013/0032388 A1 | 2/2013 | Lin et al. | |
| 2013/0069218 A1 | 3/2013 | Seah | |
| 2013/0270684 A1* | 10/2013 | Negishi | H01L 21/481 257/675 |
| 2014/0027867 A1 | 1/2014 | Goida | |
| 2014/0191419 A1 | 7/2014 | Mallik et al. | |
| 2014/0217566 A1 | 8/2014 | Goida et al. | |
| 2014/0252569 A1 | 9/2014 | Ikuma et al. | |
| 2015/0021754 A1* | 1/2015 | Lin | H01L 23/5389 257/712 |
| 2015/0084180 A1* | 3/2015 | Seko | H01L 25/0655 257/713 |
| 2015/0210538 A1 | 7/2015 | Su et al. | |
| 2015/0235915 A1* | 8/2015 | Liang | H01L 21/486 361/764 |
| 2016/0046483 A1 | 2/2016 | Cheng et al. | |
| 2016/0064355 A1* | 3/2016 | Pan | H01L 25/0657 257/704 |
| 2016/0090298 A1 | 3/2016 | Sengupta et al. | |
| 2016/0167951 A1 | 6/2016 | Goida | |
| 2017/0062340 A1* | 3/2017 | Ushijima | H01L 29/41741 |
| 2017/0345736 A1* | 11/2017 | Miyairi | H01L 23/42 |
| 2017/0345788 A1* | 11/2017 | Pan | H01L 24/73 |
| 2018/0026008 A1* | 1/2018 | Jeng | H01L 23/367 257/692 |
| 2018/0261586 A1* | 9/2018 | Scanlan | H01L 21/4882 |
| 2021/0134510 A1 | 5/2021 | Anderson et al. | |

OTHER PUBLICATIONS

Kim et al., "Multi-flip chip on lead frame overmolded IC package: A novel packaging design to achieve high performance and cost effective module package," Electronic Components and Technology Conference, 2005, pp. 1819-1821.
European Search Report dated Sep. 29, 2015 in European Patent Application No. 14152487.6 filed Jan. 24, 2014, in 5 pages.
Fairchild Semiconductor BGA 30L products page accessed on Apr. 19, 2012.

* cited by examiner

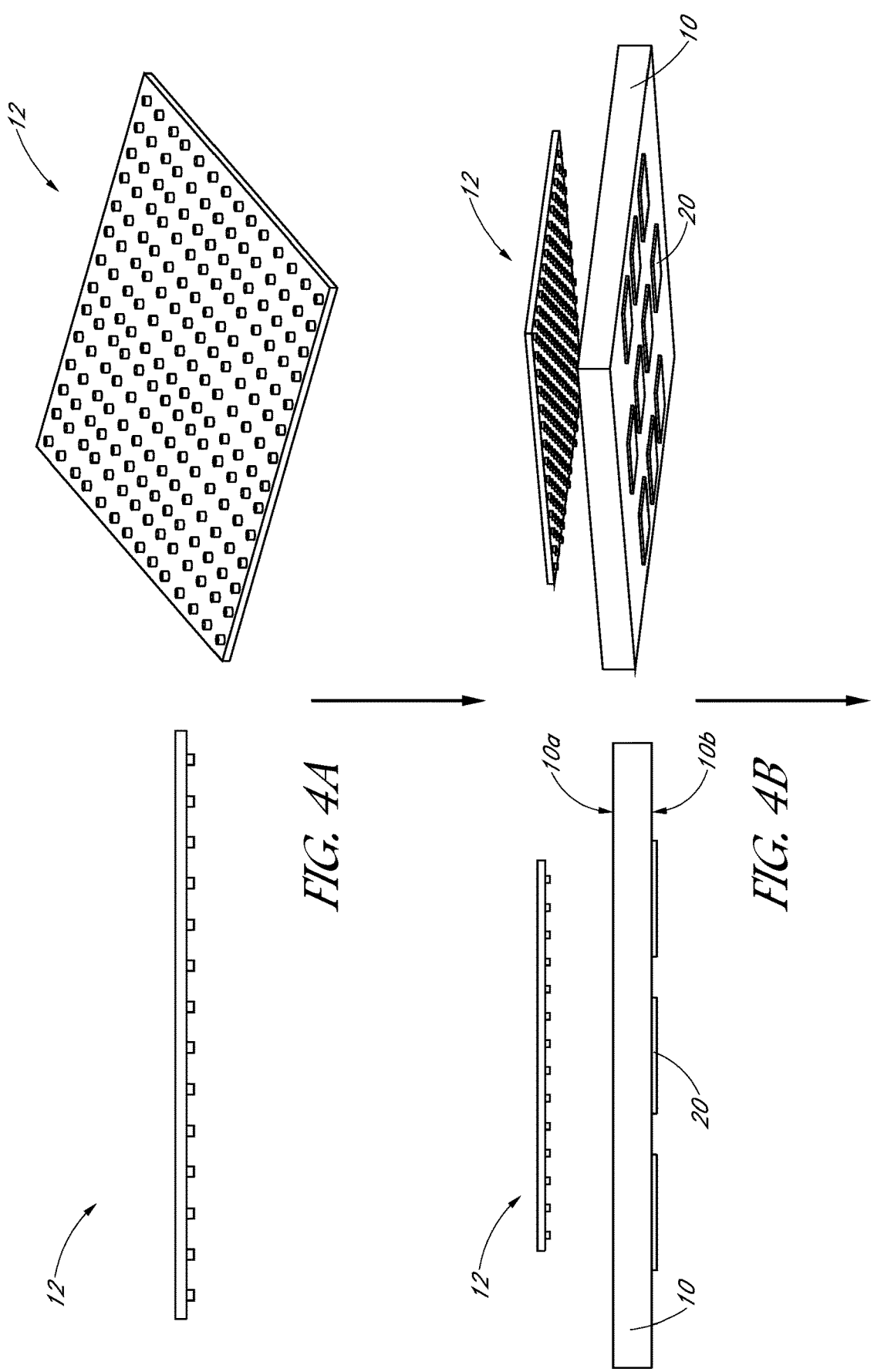

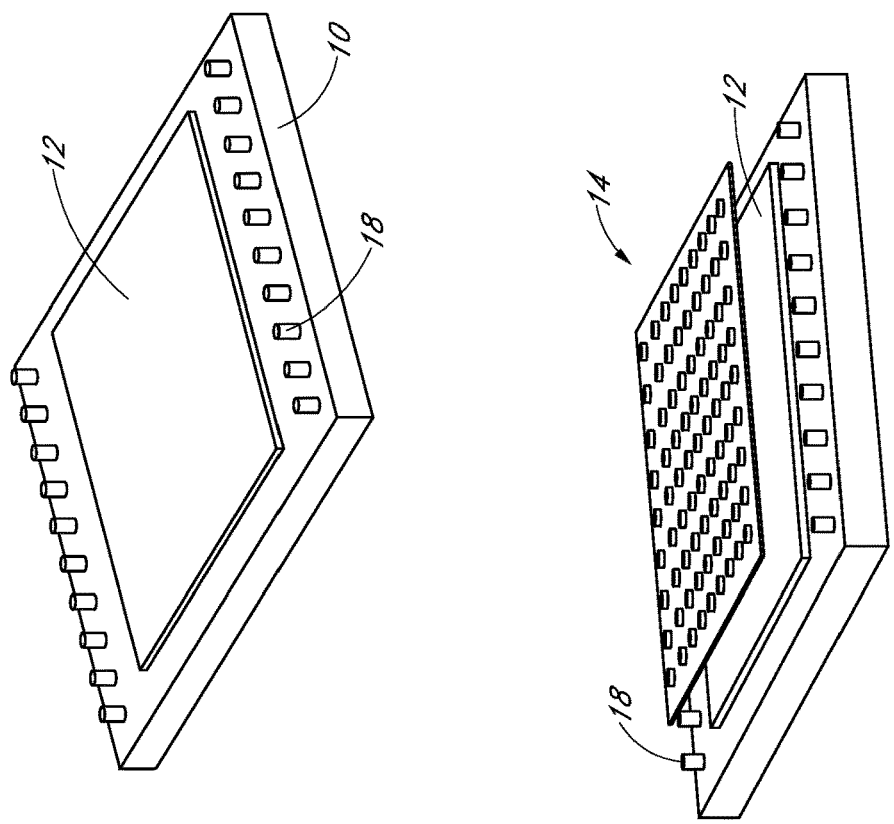
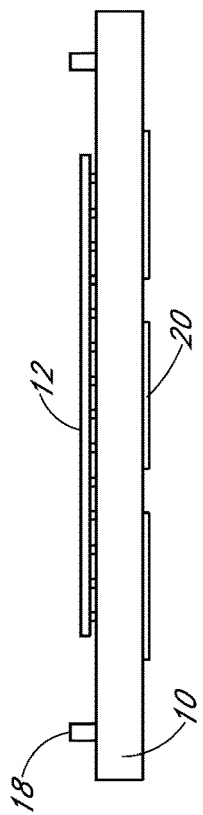
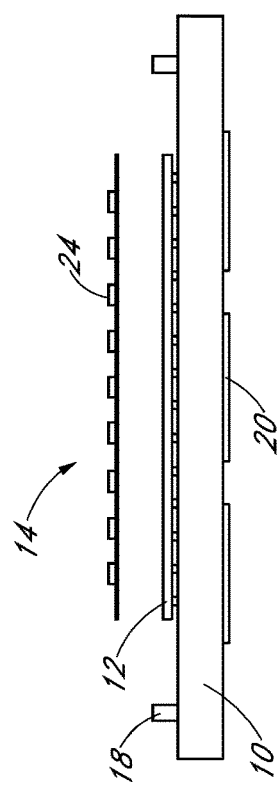
FIG. 4C
FIG. 4D

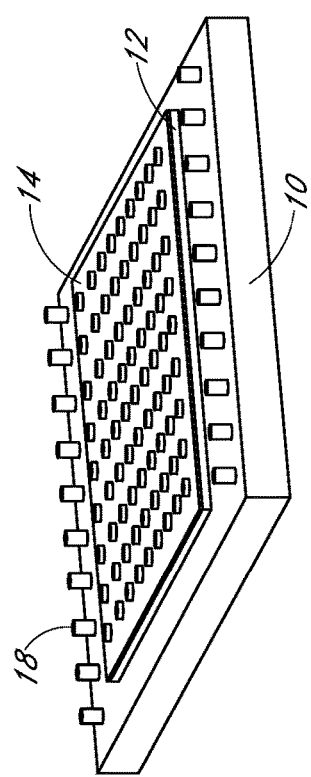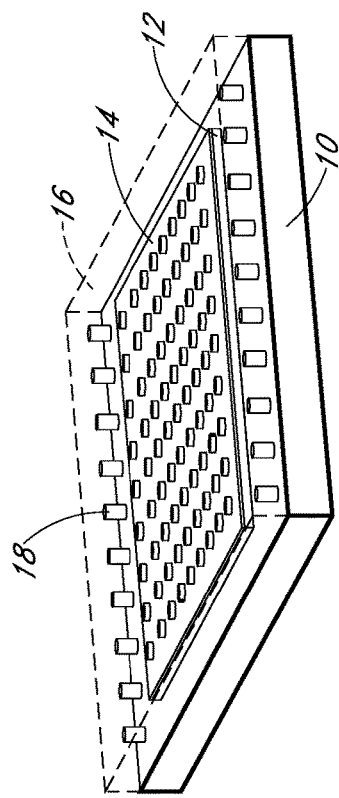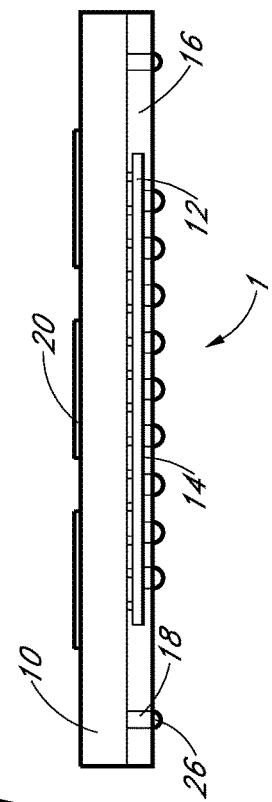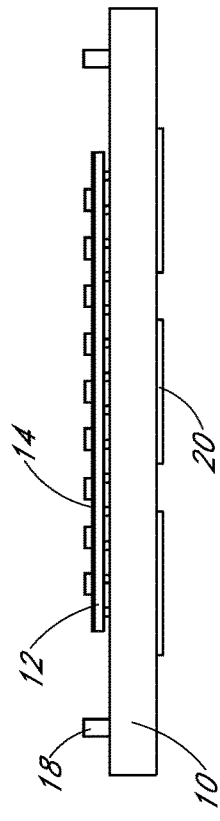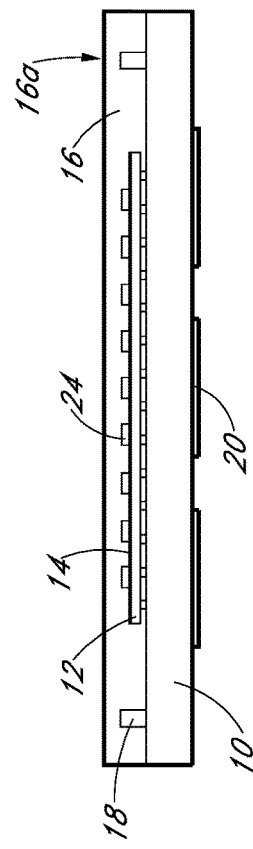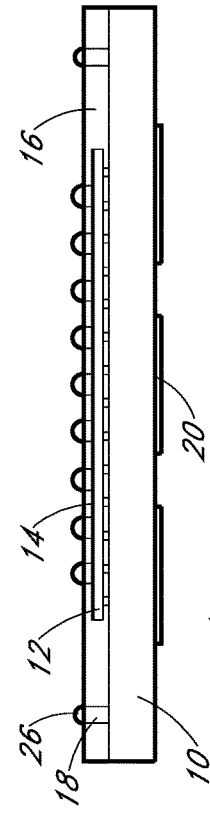
FIG. 4E    FIG. 4F    FIG. 4G

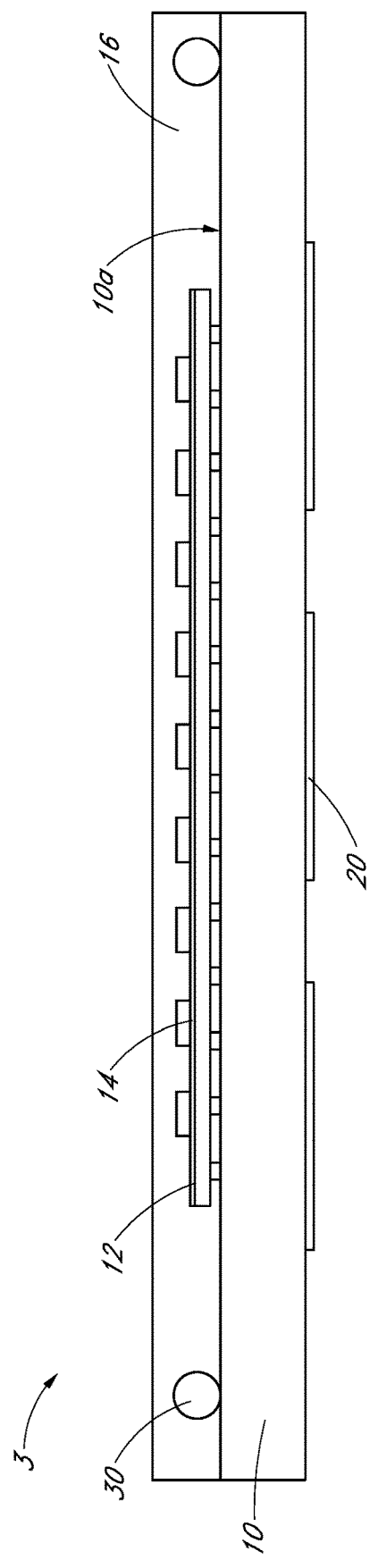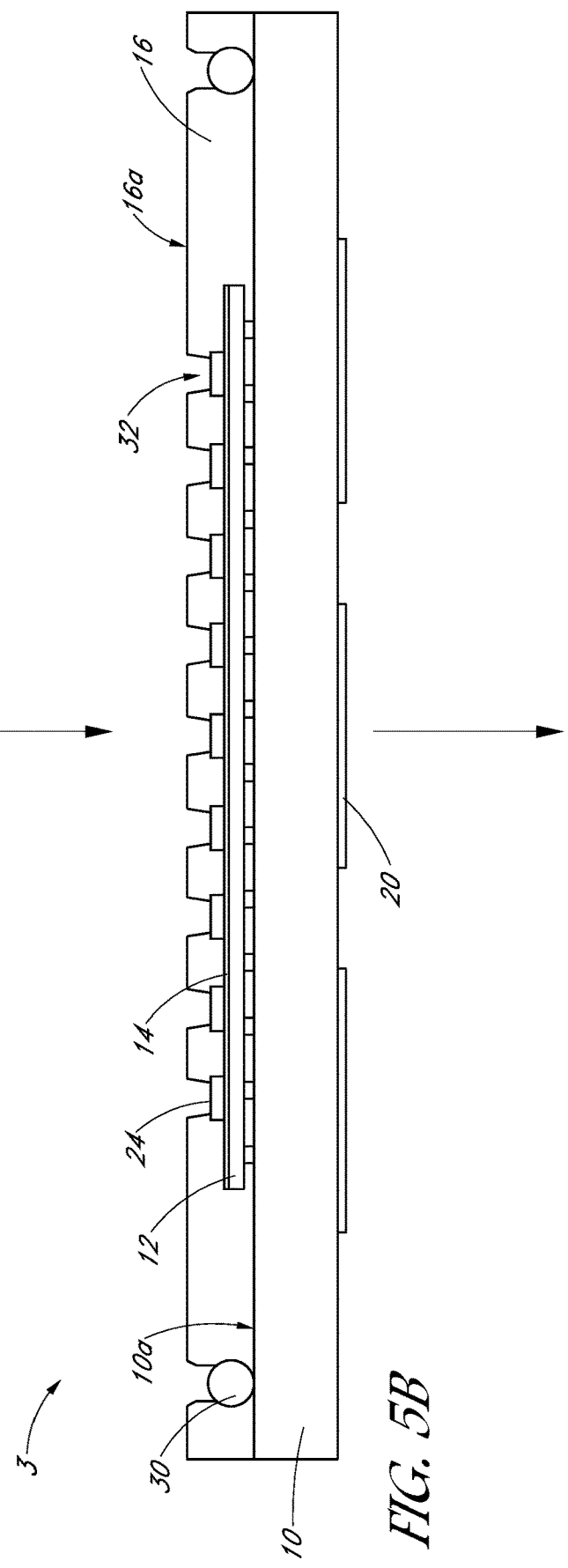
FIG. 5A
FIG. 5B

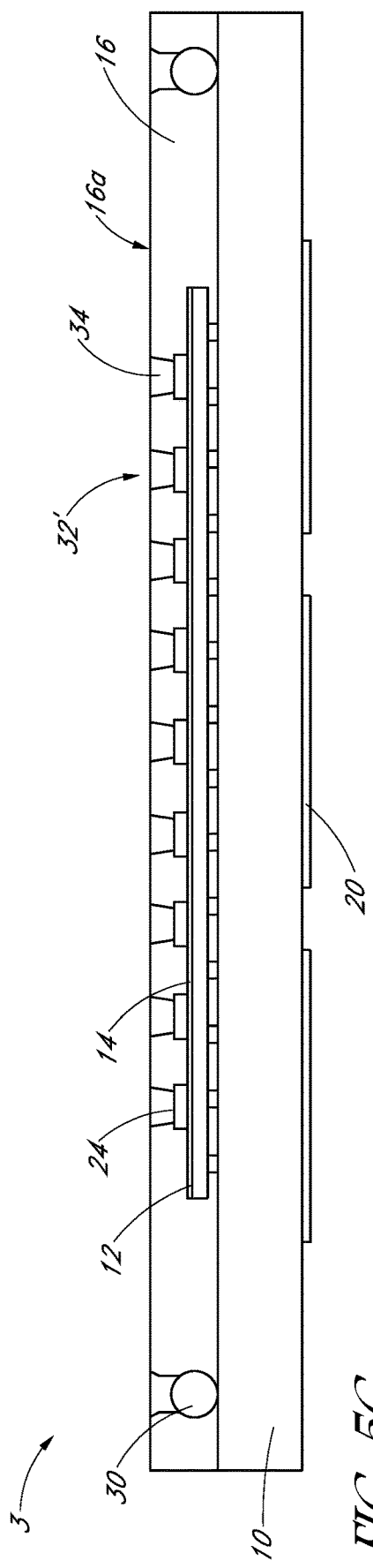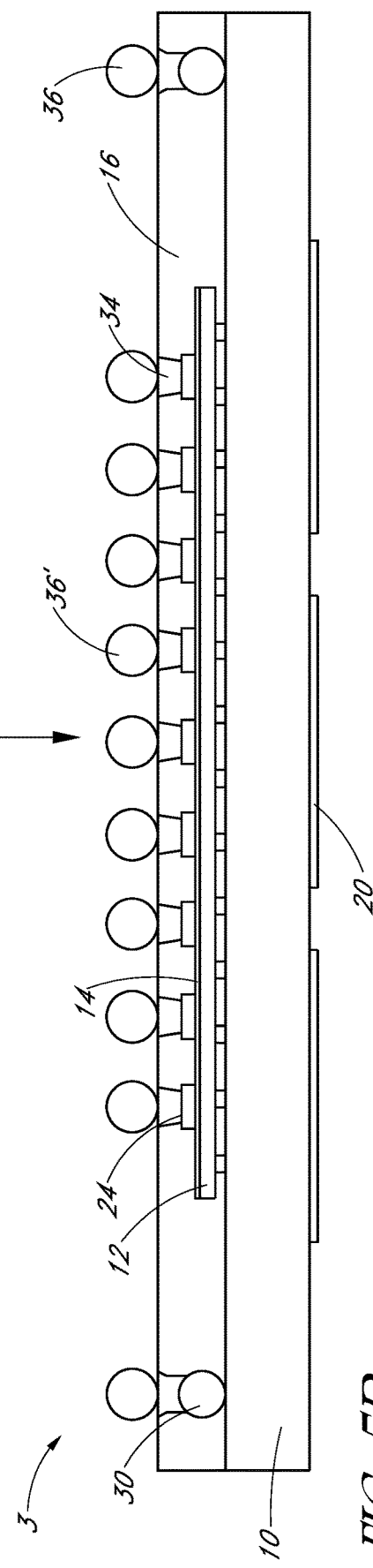

INTEGRATED DEVICE PACKAGE INCLUDING THERMALLY CONDUCTIVE ELEMENT AND METHOD OF MANUFACTURING SAME

BACKGROUND

Field

The field relates to an integrated device package, and in particular, to an integrated device package with a thermally conductive element.

Description of the Related Art

An integrated device package can include electrical components (e.g., integrated device dies, passive components such as inductors, resistors, and capacitors, etc.). Some electrical components generate heat during operation. The integrated device package can be mounted on a package substrate. The package substrate can in turn be mounted to a system board. It can be important to transfer the generated heat out of the package during operation.

SUMMARY

In one aspect, an integrated device package is disclosed. The integrated device package includes a substrate that has an upper side and a lower side opposite the upper side. The integrated device package also includes an integrated device die mounted to the lower side of the substrate. The integrated device die has a first side that faces the lower side of the substrate and a second side opposite the first side. The integrated device package also includes a molding material in which the integrated device die is at least partially embedded. The integrated device package further includes a thermally conductive element that is coupled to the second side of the integrated device die. At least a portion of the thermally conductive element exposed through the molding material.

In one embodiment, the integrated device package further includes an interconnect that is configured to provide an external connection. The interconnect extends at least partially through the molding material from the lower side of the substrate. The substrate can include an electrical pathway that electrically connects the integrated device die and the interconnect. The electrical pathway includes a trace formed in or on the substrate. The interconnect can include a pillar. The interconnect can include a solder ball. The interconnect can include a through mold via and a conductive material within the through mold via.

In one embodiment, the integrated device die is flip chip mounted to the lower side of the substrate.

In one embodiment, the substrate comprises a laminate substrate or a ceramic substrate.

In one embodiment, the integrated device package further includes an electrical component on the upper side of the substrate. The electrical component can include an antenna structure.

In one embodiment, the first side of the integrated device die includes an active side of the integrated device die that includes active circuitry.

In one embodiment, the thermally conductive element includes a heat sink. The heat sink can be attached to the integrated device die by way of an adhesive. The heat sink can provide an electrical connection to the integrated device die. The heat sink can include segments that are spaced apart from each other. The heat sink can include contacts configured to connect to an external device. The contacts of the heat sink can include bumps for solder connection. The contacts of the heat sink can include pads. The heat sink can provide an electrical ground connection to the integrated device die.

In one embodiment, the integrated device die is completely embedded in the molding material.

In one embodiment, the thermally conductive element is at least partially embedded in the molding compound.

In one embodiment, the integrated device package is a ball grid array (BGA) package.

In one embodiment, the integrated device package is a land grid array (LGA) package.

In one aspect, an integrated device package is disclosed. The integrated device package includes a substrate that has an upper side and a lower side opposite the upper side. The integrated device package also includes an integrated device die that is mounted to the lower side of the substrate. The integrated device die has a first side that faces the lower side of the substrate and a second side opposite the first side. The integrated device package also includes a thermally conductive element that is coupled to the second side of the integrated device die. The thermally conductive element is configured to provide an external connection to an external device. The integrated device package further includes an interconnect that includes a conductive pillar that is configured to provide an external electrical connection to the external device. The interconnect extends from the lower side of the substrate.

In one embodiment, the integrated device die is flip chip mounted to the lower side of the substrate.

In one embodiment, the pillar has a first height that is greater than or equal to a second height defined between the second side of the integrated device die and the lower side of the substrate.

In one embodiment, the external connection to the external device comprises a thermal connection and an electrical connection between the thermally conductive element and the external device.

In one embodiment, the integrated device package further includes a molding material in which the integrated device die is at least partially embedded.

In one embodiment, the substrate comprises a laminate substrate or a ceramic substrate.

In one embodiment, the integrated device package, further includes an electrical component on the upper side of the substrate. The electrical component can include an antenna structure.

In one embodiment, the substrate includes an electrical pathway that electrically connects the integrated device die and the interconnect.

In one embodiment, the thermally conductive element includes a heat sink. The heat sink can be coupled to the integrated device die by way of an adhesive. The heat sink can include an electrical connection for the integrated device die. The heat sink can include contacts configured to connect to the external device. The contacts of the heat sink can include bumps for solder connection. The contacts of the heat sink can include pads. The heat sink can provide an electrical ground connection to the integrated device die.

In one aspect, a method of manufacturing an integrated device package is disclosed. The method includes providing a substrate that has an upper side and a lower side opposite the upper side. The method also includes mounting an integrated device die to the lower side of the substrate. The integrated device die has a first side facing the lower side of the substrate and a second side opposite the first side. The method also includes providing a molding material such that the integrated device die is at least partially embedded in the molding material. The method further includes coupling a thermally conductive element to the second side of the integrated device die. At least a portion of the thermally conductive element is exposed through the molding material.

In one embodiment, the method further includes forming an interconnect that is configured to provide an external connection. The interconnect extends at least partially through the molding material from the lower side of the substrate.

In one embodiment, the method further includes removing a portion of the molding material to expose the portion of the thermally conductive element.

In one embodiment, the removing includes thinning the molding material by way of grinding or etching.

In one embodiment, mounting the integrated device die includes flip chip mounting the integrated device die to the lower side of the substrate.

BRIEF DESCRIPTION OF THE DRAWINGS

Embodiments of this disclosure will now be described, by way of non-limiting example, with reference to the accompanying drawings.

FIGS. 4A-4G illustrate a process flow of manufacturing the package of FIG. 1.

FIGS. 5A-5D illustrate a process flow of forming through mold vias in a package.

DETAILED DESCRIPTION

An electrical component (such as an integrated device die) included in an integrated device package can be mounted to a package substrate in various ways. For example, in some embodiments, the integrated device package can comprise a "possum" package in which the electrical component can be mounted underneath the substrate such that the electrical component hangs from the package substrate. The integrated device package that includes an electrical component (e.g., integrated device die) can comprise, for example, a ball grid array (BGA) package or a land grid array (LGA) package. In such packages, it may be difficult to transfer heat away from the electrical component due to its limited space for routing.

Various embodiments disclosed herein relate to integrated device packages that include an electrical component mounted to a package substrate, and a thermally conductive element, such as a heat sink, thermally coupled to the electrical component. The heat sink can spread heat generated by the electrical component. The electrical component can be mounted to a first side of the substrate.

An integrated device package (or "package") according to various embodiments disclosed herein can include a package substrate, a component (e.g., integrated device die) mounted on a first side of the substrate, and an thermally conductive element (e.g., a heat sink or slug) disposed such that the component is positioned between the heat sink and the package substrate. The package can include a molding material in which the component and the heat sink are at least partially embedded. The package can include interconnects on the first side of the substrate. The interconnects (e.g., conductive pillars) can extend from the first side of the substrate through the molding material.

Figure 1:
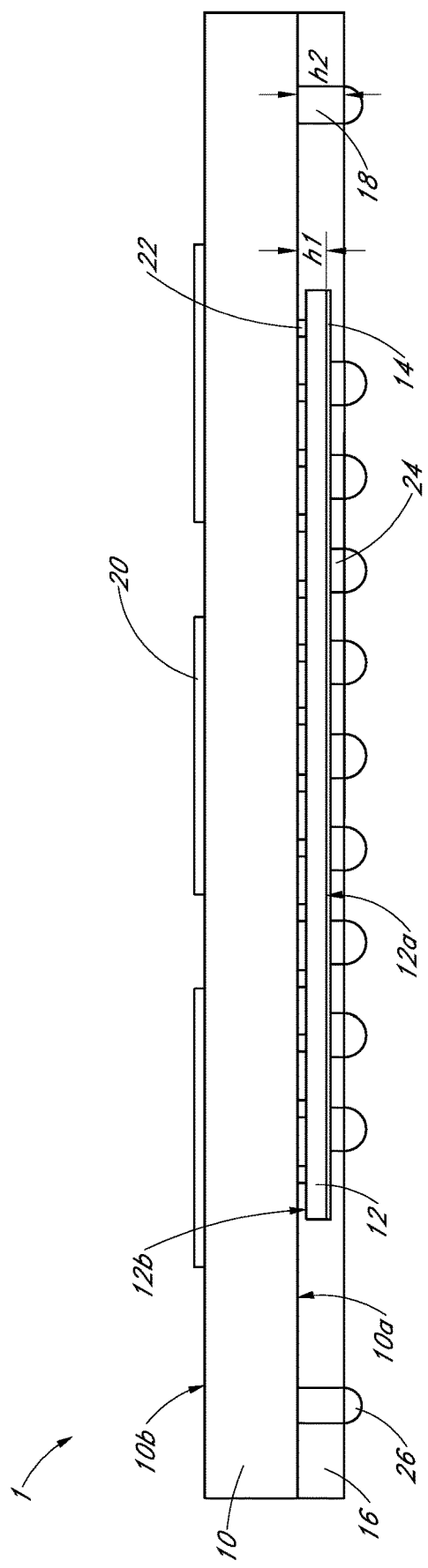
FIG. 1 is a schematic side cross-sectional view of an integrated device package according to one embodiment.

FIG. 1 is a schematic side cross-sectional view of an integrated device package 1 according to one embodiment. The package 1 can include a package substrate 10 having a first side 10a (e.g., a lower side in FIG. 1), and a second side 10b (e.g., an upper side in FIG. 1), a component 12 mounted on the first side 10a of the package substrate 10, and a thermally conductive element (e.g., a heat sink or slug 14) thermally coupled to the component 12. The package 1 can include a molding material 16 in which the component 12 and the heat sink 14 are at least partially embedded. The package 1 can include a plurality of electrical interconnects (e.g., pillars 18) that extend downwardly from the first side 10a of the package substrate 10 through the molding material 16. The illustrated package 1 can also include an electrical component (e.g., an antenna 20) on the second side 10b of the package substrate 10. In some embodiments, the package 1 can be referred to as a ball grid array (BGA) arrangement, in which solder balls 26 are connected to the interconnects 18 and configured to electrically connect to an external device, such as an external system board.

The package substrate 10 can comprise any suitable type of package substrate. For example, the package substrate 10 can comprise a laminate substrate (such as a printed circuit board, or PCB), a ceramic substrate, a leadframe substrate, etc. The first side 10a of the package substrate 10 can be referred to as a lower side and the second side 10b of the package substrate 10 can be referred to as an upper side, in various orientations. The package substrate 10 can provide an electrical connection between the component 12 and the pillar 18, and between the antenna 20 and the component 12. For example, the package substrate 10 can comprise conductive lines and/or traces (not illustrated).

The component 12 can comprise any suitable type of component, such as an electrical component. The component 12 can comprise, for example, an integrated device die (for example, a processor die, a microelectromechanical systems die, a memory die, a sensor die, an optical die, etc.), a passive component such as inductors, resistors, and capacitors, etc., or any other suitable type of component. In some embodiments, the integrated device die can include active circuitry. The component 12 can comprise a component that generates heat during operation. For example, the component 12 can comprise an integrated device die, such as a high-speed radio frequency (RF) or microwave communications die. The component 12 can have a first side 12a and a second side 12b opposite the first side 12a. The component 12 can be mounted and electrically connected to the substrate 10. In the illustrated embodiment, the component 12 is flip-chip mounted to the first side 10a of the package substrate 10. In such embodiments, the second side 12b of the component 12 can be coupled to contacts on the first side 10a of the package substrate 10 by way of, for example, solder connections 22. An underfill material can be provided between and around solder connections 22. In other embodiments, the component 12 can be electrically connected to the package substrate 10 by way of wire bonds. In such arrangements, the first side 12a can be mounted to the package substrate 10 and contact pads on the second side 12b can be wire bonded to the package substrate 10. In such embodiments, the height of the molding material 16 may be adjusted to account for the height of the bonding wires. The first side 12a of the component 12 can be positioned at a height h1 relative to the first side 10a of the package substrate 10. In some embodiments, the height h1 can be defined at least in part by a sum of a height of the solder connection 22 and a height of the component 12.

The heat sink 14 can comprise any thermally conductive material. In some embodiments, the heat sink 14 can have a thermal conductivity that is greater than a thermal conductivity of the component 12. In some embodiments, the heat sink 14 can comprise a metal, such as copper, stainless steel, aluminum, tungsten, chrome-molybdenum (CrMo) steel, etc., or ceramic. For example, the heat sink 14 can comprise an etched copper material that is manufactured by way of, for example, half etching a leadframe structure, or can comprise a pressed ceramic that is manufactured by way of die pressing. In other embodiments, the heat sink 14 can comprise a generally planar conductive sheet or member. In some implementations, it can be beneficial to match the coefficient of thermal expansion (CTE) of the heat sink 14 with the component 12 and/or the molding material 16.

The heat sink 14 can be coupled with the component 12 in various ways. In some embodiments, an adhesive (e.g., a thermal interface material or a die attach material) can be provided between the first side 12a of the component 12 and the heat sink 14. The adhesive can be electrically conductive or non-conductive. In some embodiments, the adhesive can comprise a thermally-conductive adhesive. In some embodiments, a thermally conductive material can be deposited on the first side 12a of the component 12 to form the heat sink 14.

As illustrated in FIG. 1, the heat sink 14 can comprise contacts (e.g., protrusions/bumps 24) on a surface of a heat sink plate. However, the heat sink 14 can comprise a heat sink plate without the bumps, for example, in embodiments in which the heat sink 14 comprises a generally planar member. In some embodiments, the heat sink 14 can comprise a thermal pathway between the component 12 and an external substrate (e.g., a PCB, etc.), or an external device. In some embodiments, the heat sink 14 may be electrically inactive such that the heat sink 14 does not provide an electrical connection to the component 12. The heat sink 14 can be connected to the external substrate or other external device by way of, for example, solder balls 26.

In other embodiments, however, in addition to providing a thermal pathway to the external device, the heat sink 14 can also provide an electrical connection between the component 12 and the external device, such as an external system substrate (e.g., a PCB, etc.). In such embodiments, the heat sink 14 can provide, for example, an input/output (I/O) connection between the component 12 and the external device. For example, in some embodiments, the heat sink 14 can provide an electrical ground connection to the component 12. In some embodiments, the heat sink 14 can comprise multiple electrically separate portions that provide multiple I/O connections to the component 12. For example, the heat sink 14 can be divided into a plurality of electrically separate segments configured to provide power, ground, and/or signal connections to the component 12.

In some embodiments, the heat sink 14 can be shaped and/or patterned so as to effectively transfer heat from the component 12. In some embodiments, the heat sink 14 can comprise portions that are spaced apart from each other. In some embodiments, the heat sink 14 can be applied over a portion or portions of the first side 12a of the component 12. In the illustrated embodiment, the heat sink 14 covers more than half the area of the first side 12a of the component 12. For example, the heat sink 14 can cover at least 50%, at least 75%, at least 85%, or at least 95% of the area of the first side 12a of the component 12. In some embodiments, the heat sink 14 can cover substantially the entire first side 12a of the component 12. In other embodiments, the heat sink 14 can cover less than half the area of the first side 12a of the component 12. For example, the heat sink 14 can be sized so as to cover only portions of the component 12 that generate a significant amount of heat, while the remainder of the component 12 may be uncovered by the heat sink 14.

The molding material 16 can comprise any suitable material, such as a polymer, e.g., an epoxy material. For example the molding material 16 can provide mechanical support for the component 12. In some embodiments, the molding material 16 can be applied to portions of the package substrate 10, the component 12, the heat sink 14 and/or the pillar 18. In some embodiments, the molding material 16 can comprise two or more molding materials. In some embodiments, the molding material 16 can comprise segments and the segments can be spaced apart from each other.

In the illustrated embodiment, the pillar 18 is illustrated as the interconnect. However, the interconnect can comprise any suitable electrically conductive structure. For example, the interconnect com comprise a through hole via, filled via, solder ball, etc. The pillar 18 can provide electrical communication between the package substrate 10 and an device, such as an external substrate (e.g., a PCB, etc.). The pillars 18 can comprise a ball grid array (BGA) pattern. The pillars 18 can be attached to corresponding pads of the external substrate or the external device by way of, for example, the solder balls 26.

The pillar 18 has a height h2. The height h2 of the pillar 18 can be greater than the height h1 of the component 14 relative to the first side 10a of the package substrate 10. Therefore, when the package 1 is mounted to an external substrate or an external device via the pillar 18, the component 12 can be spaced apart from the external substrate or the external device.

In some embodiments, the electrical element (e.g., the antenna 20) on the second side 10b of the substrate 10 can be electrically coupled with the component 12 and/or an external device, such as an external substrate, by way of the pillars 18. The antenna 20 can comprise, for example, an antenna array. In some embodiments, the antenna can provide wireless communications between the package 1 and an external device. In some embodiments, another component or a different component (e.g., an integrated device die) can be mounted on the second side 10b of the package substrate 10.

Figure 2A:
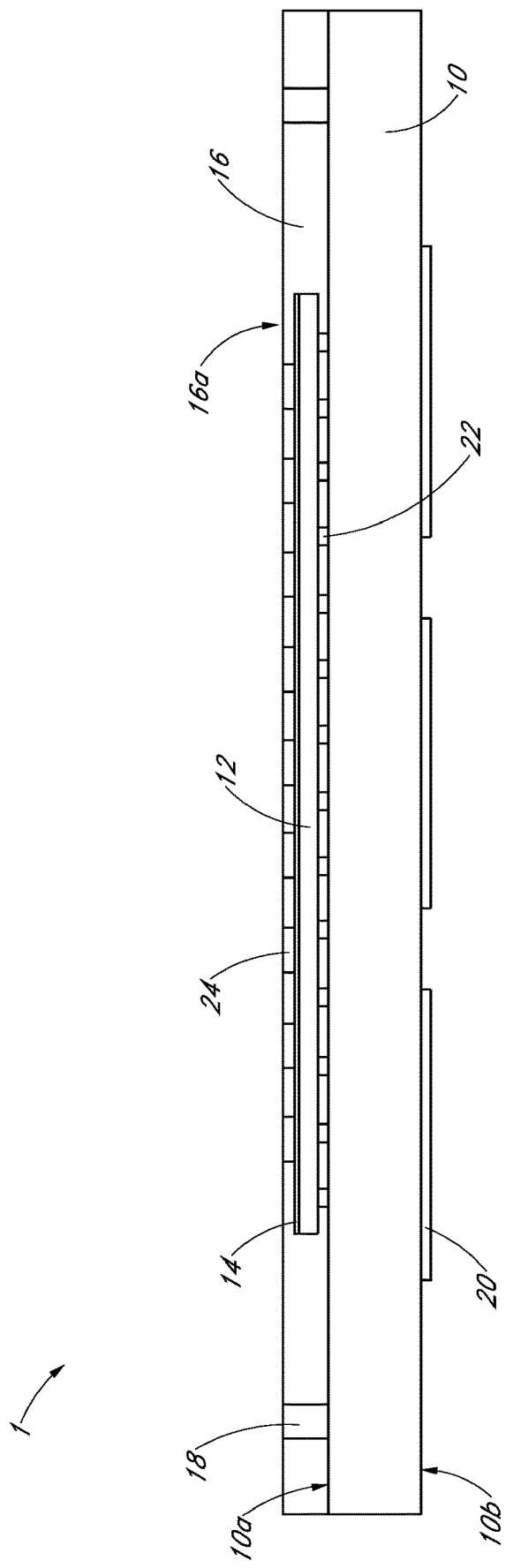
FIG. 2A is a schematic side cross-sectional view of the package of FIG. 1 without solder balls.

FIG. 2A is a schematic side cross-sectional view of the package 1 illustrated in FIG. 1 without the solder balls 26. The package 1 illustrated in FIG. 2A is flipped upside down relative to the package 1 illustrated in FIG. 1.

Figure 2B:
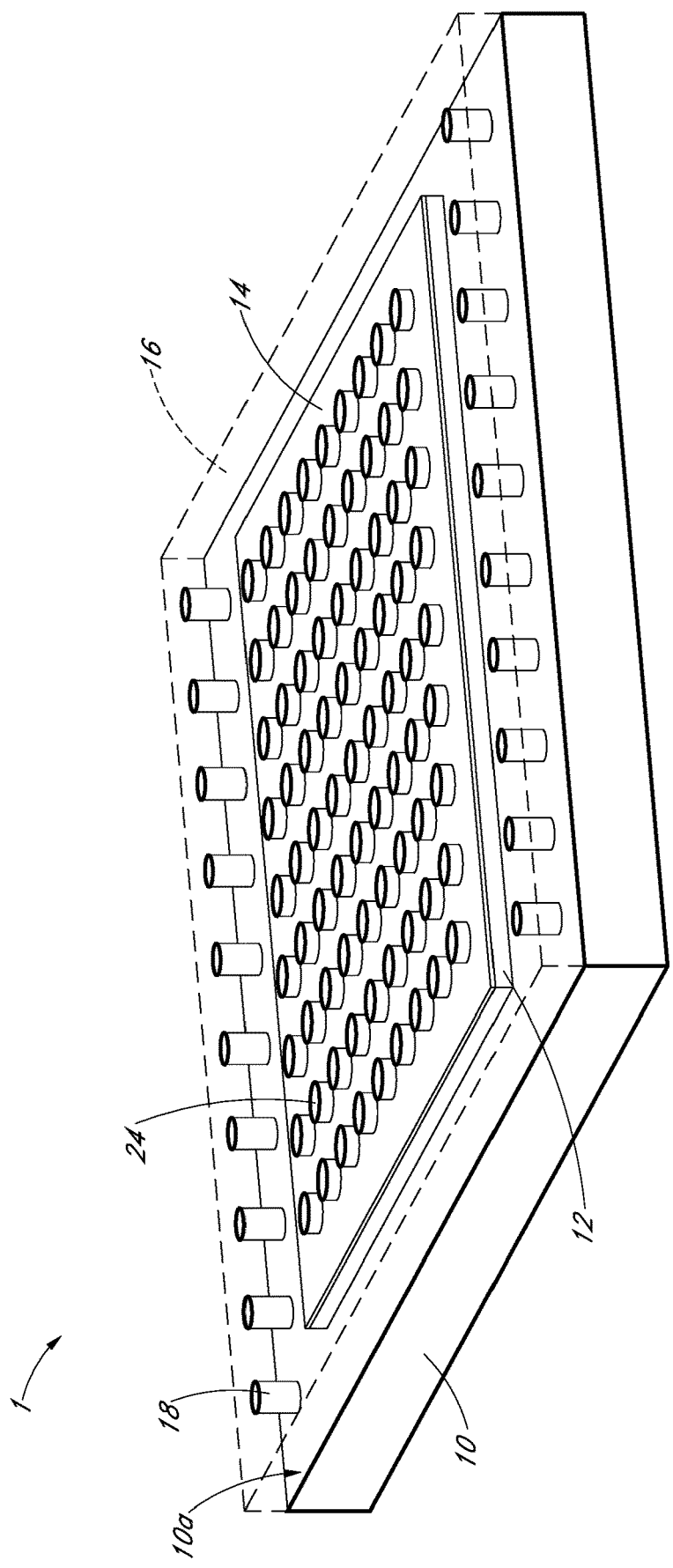
FIG. 2B is a schematic perspective view of the package of FIG. 2A.

FIG. 2B is a schematic perspective view of the package 1 illustrated in FIG. 2A. In FIG. 2B, the molding material 16 is being transparent to show the component 12, the heat sink 14, and the pillars 18. As illustrated, the package 1 can comprise pillars 18 positioned at peripheral portions of the component 12, for example, at locations outside the component 12 and the heat sink 14. The illustrated package 1 includes twenty (20) pillars 18. However, the package can include any number of pillars 18 having any suitable arrangement/pattern at various locations on the first side 10a of the package substrate 10. Similarly, the heat sink 14 can include any suitable number of the bumps 24 having any suitable arrangement/pattern.

As shown in FIGS. 2A-2B, the bumps 24 and/or the pillars 18 can be exposed at an exterior surface 16a of the molding material 16. For example, in various embodiments, the pillars 18 and bumps 24 can be co-planar or flush with the exterior surface 16a of the molding material 16. Thus, the exposed pillars 18 can electrically connect with the external device by way of a suitable interconnect (such as solder balls). Similarly, the exposed bumps 24 of the heat sink 14 can thermally couple to the external device by way of suitable interconnects. As explained above, the exposed bumps 24 can also provide electrical communication with the external device. In embodiments in which the heat sink 14 comprises a planar plate, then the entire heat sink 14 can be exposed through the molding material 16.

Figure 3A:
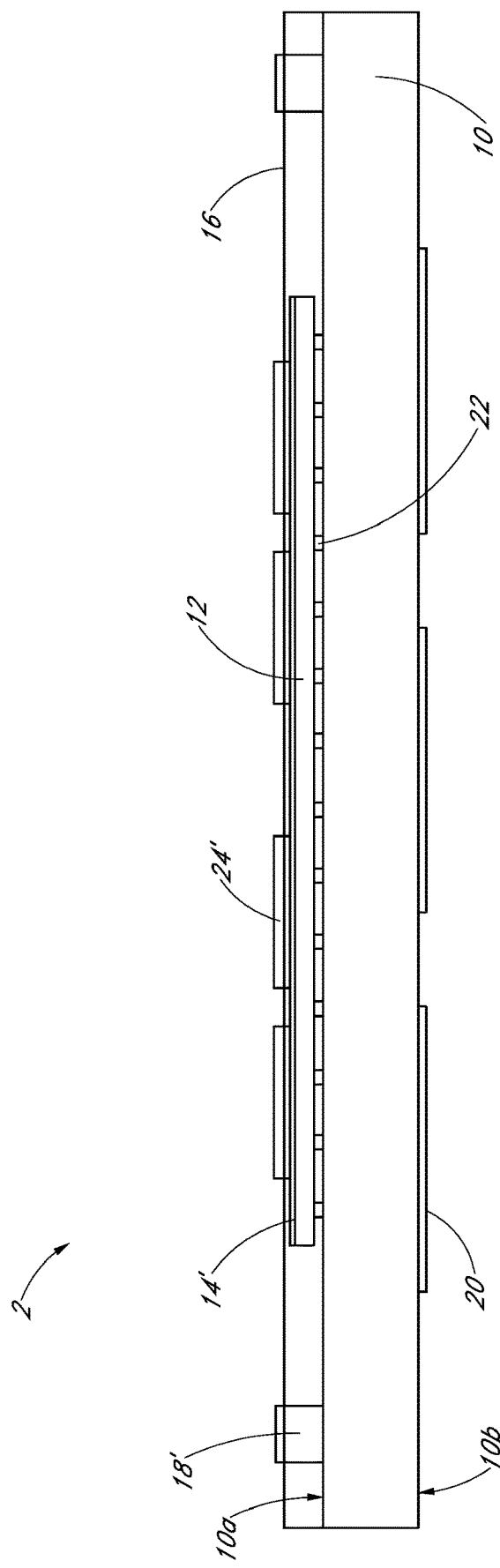
FIG. 3A is a schematic side cross-sectional view of a package according to another embodiment.
Figure 3B:
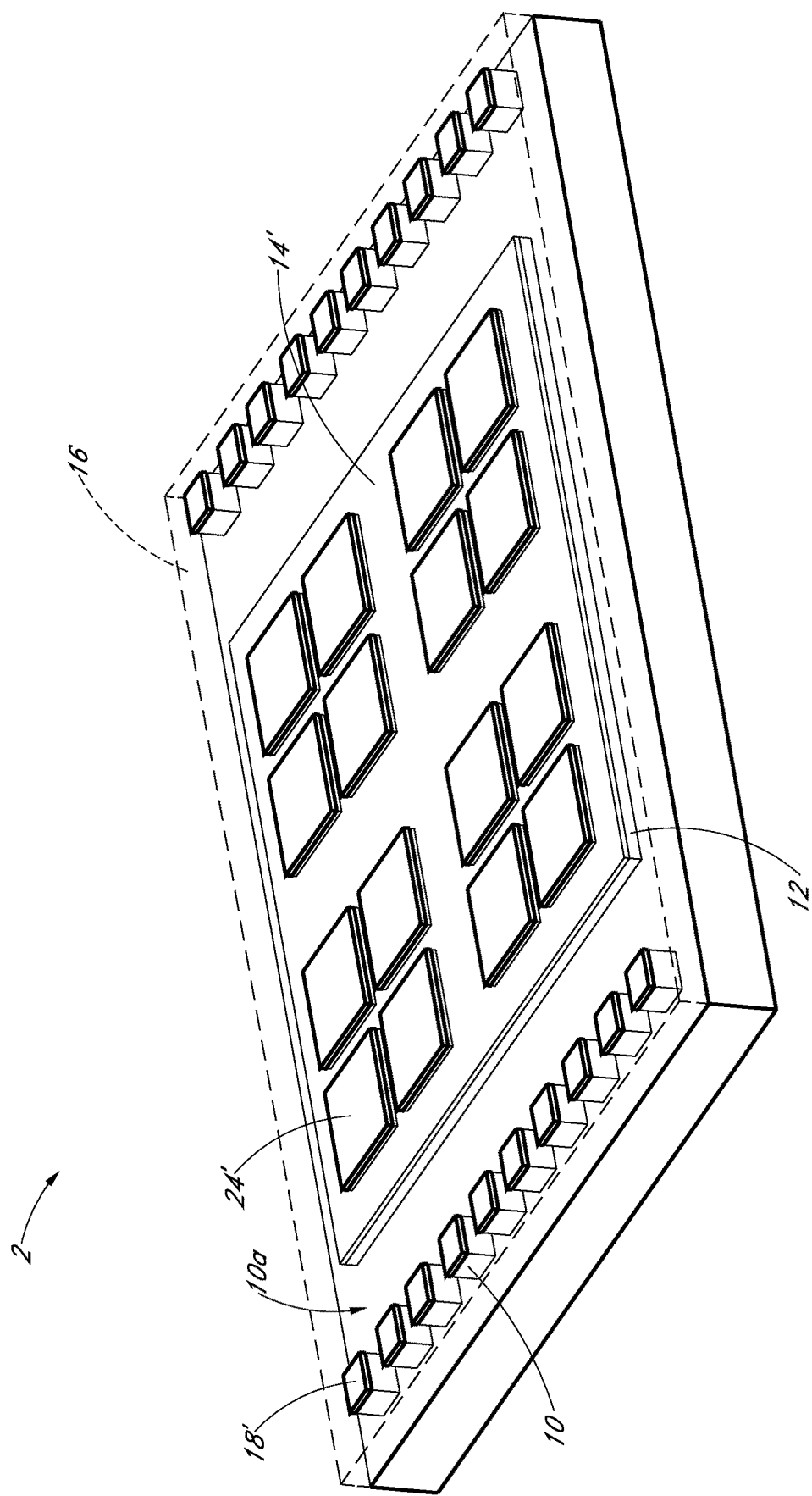
FIG. 3B is a schematic perspective view of the package of FIG. 3A.

FIG. 3A is a schematic side cross-sectional view of a package 2 according to another embodiment. FIG. 3B is a schematic perspective view of the package 2 illustrated in FIG. 3A. The package 2 of FIGS. 3A-3B can be generally similar to the package 1 illustrated in FIGS. 1-2B. In some embodiments, the package 2 can be referred to a land grid array (LGA) arrangement, in which a plurality of flat conductive lands 24' are provided on the heat sink 14. As with the embodiment of FIGS. 1-2B, the conductive lands 24 can provide thermal and/or electrical communication between the component 12 and the external device.

Unlike the pillars 18 illustrated in FIGS. 1-2B that have a cylindrical shape, the pillars 18' illustrated in FIGS. 3A-3B have a rectangular prism shape. As illustrated, portions of the pillars 18' can protrude through the molding material 16 and be exposed so as to connect to the external device. The heat sink 14' of the package 2 comprises flat contact pads 24'. The contact pads 24', like the bumps 24 of package 1, can be configured to connect to an external substrate or an external device.

FIGS. 4A-4G illustrate a process flow of manufacturing the package 1 illustrated in FIG. 1. Though the process flow is specific to the package 1, similar processes can be used to manufacture any other embodiments of the package disclosed herein. FIG. 4A shows a schematic side cross-sectional view of a component 12 and a schematic perspective view of the component 12. The component 12 can comprise any suitable type of electrical component, such as an integrated device die (e.g., a processor die, a microelectromechanical systems die, a memory die, a sensor die, an optical die, etc.). The component 12 can include solder connections 22 connected to contacts on the first side 10a of the package substrate 10. In some embodiments, the component 12 can be wire bonded to the package substrate 10. At FIG. 4B, the component 12 is positioned over a first side 10a of a package substrate 10 that includes an antenna attached to a second side 10b of the package substrate 10. Terminals on the component 12 can be aligned with corresponding pads on the first side 10a of the package substrate 10.

FIG. 4C illustrates a schematic side cross-sectional view and a schematic perspective view of the component 12 after the component 12 is mounted on the package substrate 10. At FIG. 4C, interconnects (e.g., pillars 18) can be formed on the first side 10a of the package substrate 10. A height of the pillars 18 can be greater than a height of the component 12. The height of the pillars 18 in FIG. 4C may be greater than the height of the pillars 18 in FIG. 4G. In other words, a portion of the pillar 18 can be removed by, for example, the thinning process explained low with respect to FIG. 4F. An underfill can be applied around the solder connections 22 and/or between the component 12 and the package substrate 10. When the component 12 is wire bonded to the package substrate, an adhesive can be provided between the component 12 and the package substrate 10.

At FIG. 4D, a heat sink 14 is provided over the component 12. FIG. 4E illustrates a schematic side cross-sectional view and a schematic perspective view of the component 12 and the heat sink 14 after the heat sink 14 is mounted on the package substrate 10. The heat sink 14 can be mounted to the component 12 by way of an adhesive (e.g., a thermal interface material or a die attach material). As illustrated in FIGS. 4D and 4E, the heat sink can comprise bumps 24. The heat sink 14 can comprise a plurality of segments that are spaced apart from each other. The plurality of segments can be selectably positioned so as to effectively dissipate heat generated by the component 12. In some embodiments, the heat sink 14 can comprise a multi-layer heat sink in which the heat sink comprises multiple layers of thermally conductive materials. In some embodiments, a plurality of separate heat sinks can be provided over the component 12. In some embodiments, the heat sink 14 can be configured to provide external connection to an external device, such as an external system board. For example, the heat sink 14 can provide an external thermal connection and/or an external electrical connection to an external device, such as an external system board.

At FIG. 4F, a molding material 16 is applied over the package substrate 10, thereby embedding the component 12, the heat sink 14, and the pillars 18. The molding material 16 can comprise any suitable material, such as a polymer, e.g., an epoxy material. In some embodiments, the component 12, the heat sink 14, and/or the pillars 18 can be fully embedded in the molding material 16. The molding material 16 can be thinned (e.g., etched, polished, or grinded) to expose the pillars 18 and/or the bumps 24. For example, the molding material 16 can be thinned from an exterior surface 16a of the molding material 16. In some embodiments, the pillars 18 and/or the bumps 24 can be thinned to match the heights of the pillars 18 and the bumps 24. In some embodiments, the heat sink 14 may not comprise the bumps 24. In such embodiments, an exposed portion of the heat sink can comprise a surface of the heat sink 14.

FIG. 4G illustrates cross sections of the package 1 after applying solder balls to the pillars 18 and the bumps 24. The package 1 illustrated on the left side of FIG. 4G is oriented such that the first side 10a of the package substrate 10 is facing up and the package 2 illustrated on the right side of FIG. 4G is oriented such that the first side 10a of the package substrate 10 is facing down. The package 1 of FIG. 4G can be mounted to an external device, such as a system board, by soldering the solder balls to corresponding pads or lands of the external device. The bumps of the heat sink 14 can provide a thermal pathway between the component 12 and the external device. In some embodiments, the heat sink 14 can also provide electrical communication between the components 12 and the external device. The pillars 18 can also be soldered to corresponding lands or pads of the external device to electrically connect the package 1 and the external device.

FIGS. 5A-5D illustrate a process flow of forming through mold vias of a package 3 according to another embodiment. FIG. 5A is a schematic side cross-sectional view of the package 3 prior to forming the vias. The package 3 can have an interconnect (e.g., a solder ball 30) attached to the first side 10a of the package substrate 10. In some embodiments, the pillar 18 disclosed herein can be used in place of the solder ball 30.

FIG. 5B illustrates open through mold vias 32 formed through portions of the molding material 16 that expose the solder balls 30 and bumps 24 of a heat sink 14. For example, the open through mold vias 32 can be formed by way of etching, or drilling (e.g., laser drilling). Heights or depths of the open through mold vias 32 for the solder balls 30 and the bumps 24 can vary in some embodiments. When a height of the solder balls 30 relative to the first side 10a of the package substrate 10 is higher than a height of the bumps 24 relative to the first side 10a of the package substrate 10, the height or depth of the open through mold vias 32 for the solder balls can be shorter than the height or depth of the open through mold vias 32 for bumps 24.

FIG. 5C illustrates interconnects (e.g. through mold vias 32') filled with a conductive material 34. The conductive material 34 can comprise any suitable material. For example, the conductive material 34 can comprise copper, stainless steel, aluminum, tungsten, chromoly steel, etc. In some embodiments, the conductive material 34 can be filled by way of a plating procedure. In some embodiments, a planarization process, which panelizes the exterior surface 16a of the molding material 16 and the conductive material 34, can follow after the conductive material 34 is provided. In some embodiments, the conductive material 34 can comprise the same material as the heat sink 14.

FIG. 5D illustrates solder balls 36, 36' provided over the conductive material 34. The solder balls 36, 36' can be configured to connect the package 3 to an external substrate or an external device. In some embodiments, the solder balls 36 that are disposed over the solder balls 30 can provide external electrical connections to an external device, such as an external system board. In some embodiments, the solder balls 36' disposed over the bumps 24 can provide external connection (e.g., an external electrical connection and/or an external thermal connection) to an external device, such as an external system board. In some embodiments, the solder balls 36' can provide an input/output (I/O) connection for the component 12.

Figure 6:
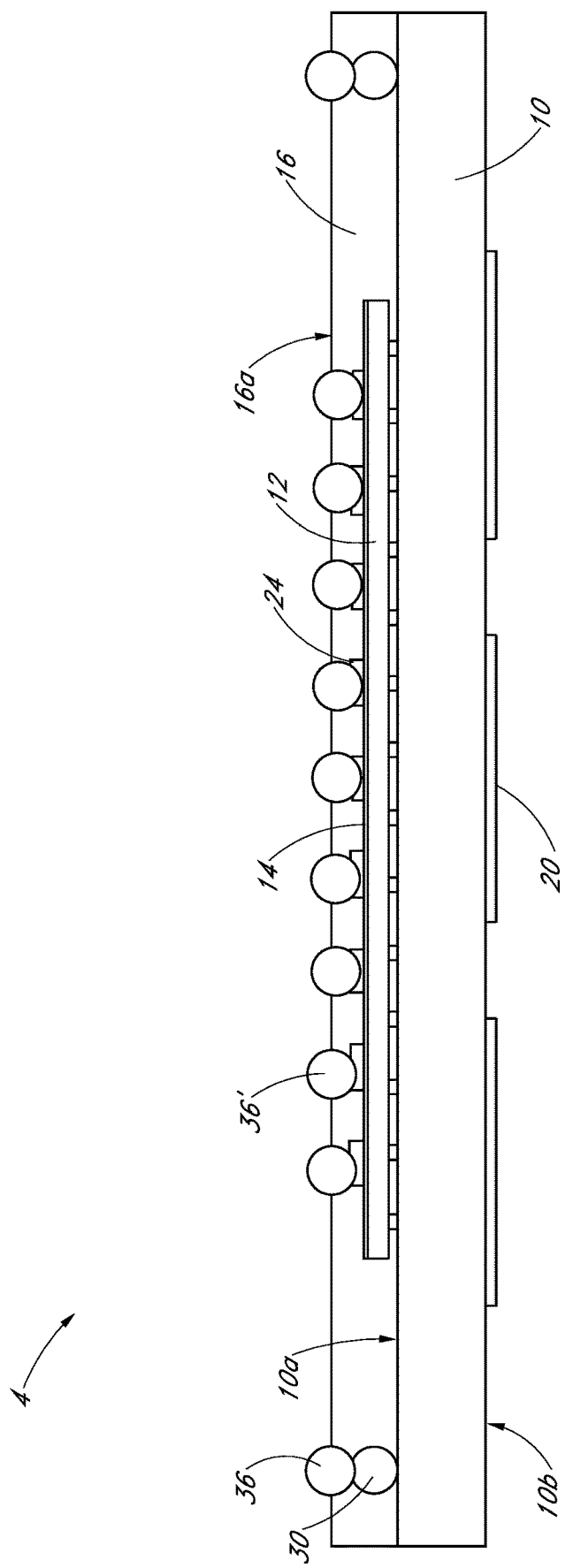
FIG. 6 is a schematic side cross-sectional view of a package according to another embodiment.

FIG. 6 is a schematic side cross-sectional view of the package 4. The package 4 is generally similar to the package 3 illustrated in FIG. 5D. Unlike the package 3, in package 4, the solder balls 36, 36' are respectively provided over the solder balls 30 and the bumps 24 without the conductive material 34 therebetween. In some embodiments, the solder balls 30 and the solder balls 36 can together serve as interconnects to the external device. In some embodiments, because the package 4 does not include the conductive material 34, a thickness of the package 4 can be thinner than a thickness of the package 3. In some embodiments, the solder balls 36, 36' can be controllably provided such that the solder balls 36, 36' protrude above the exterior surface 16a of the molding material 16 or be flush or coplanar with the exterior surface 16a of the molding material 16.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. An integrated device package comprising:
a substrate having an upper side and a lower side opposite the upper side;
an integrated device die mounted to the lower side of the substrate, the integrated device die having a first side facing the lower side of the substrate and a second side opposite the first side;
a molding material in which the integrated device die is at least partially embedded; and
a heat sink including a generally planar member having a top surface and a bottom surface, and protrusions extending from the bottom surface of the generally planar member, the top surface of the generally planar member coupled to the second side of the integrated device die, at least a portion of the bottom surface covered by the molding material, and at least a portion of the heat sink exposed through the molding material.

2. The integrated device package of claim 1, further comprising an interconnect configured to provide an external connection, the interconnect extending at least partially through the molding material from the lower side of the substrate, wherein the substrate comprises an electrical pathway that electrically connects the integrated device die and the interconnect.

3. The integrated device package of claim 2, wherein the interconnect comprises a pillar, a solder ball, or a through mold via and a conductive material within the through mold via.

4. The integrated device package of claim 1, wherein the integrated device die is flip chip mounted to the lower side of the substrate, and the substrate comprises a laminate substrate or a ceramic substrate.

5. The integrated device package of claim 1, further comprising an electrical component on the upper side of the substrate, the electrical component comprises an antenna structure.

6. The integrated device package of claim 1, wherein the heat sink covers at least 50% of an area of the second side of the integrated device die.

7. The integrated device package of claim 1, wherein the heat sink provides an electrical connection to the integrated device die.

8. The integrated device package of claim 1, wherein the heat sink comprises contacts configured to connect to an external device.

9. The integrated device package of claim 1, wherein the integrated device die is completely embedded in the molding material.

10. The integrated device package of claim 1 is a ball grid array (BGA) package or a land grid array (LGA) package.

11. An integrated device package comprising:
a substrate having an upper side and a lower side opposite the upper side;

an integrated device die mounted to the lower side of the substrate, the integrated device die having a first side facing the lower side of the substrate and a second side opposite the first side;

a molding material in which the integrated device die is at least partially embedded, the molding material having a first side facing the lower side of the substrate and a second side opposite the molding material;

a thermally conductive element coupled to the second side of the integrated device die by way of a thermal interface material, the thermally conductive element configured to provide an external connection to an external device; and an interconnect comprising a conductive pillar configured to provide an external electrical connection to the external device, the interconnect extending from the lower side of the substrate to the second side of the molding material.

12. The integrated device package of claim 11, wherein the integrated device die is flip chip mounted to the lower side of the substrate, and the substrate comprises a laminate substrate or a ceramic substrate.

13. The integrated device package of claim 11, wherein the conductive pillar has a first height that is greater than or equal to a second height defined between the second side of the integrated device die and the lower side of the substrate.

14. The integrated device package of claim 11, wherein the external connection to the external device comprises a thermal connection and an electrical connection between the thermally conductive element and the external device.

15. The integrated device package of claim 11, further comprising a ball grid array (BGA) pattern, and the conductive pillar defines a portion of the BGA.

16. The integrated device package of claim 11, further comprising an electrical component on the upper side of the substrate, wherein the electrical component comprises an antenna structure.

17. The integrated device package of claim 11, wherein the thermally conductive element comprises a heat sink.

18. A method of manufacturing an integrated device package, the method comprising:

providing a substrate having an upper side and a lower side opposite the upper side;

mounting an integrated device die to the lower side of the substrate, the integrated device die having a first side facing the lower side of the substrate and a second side opposite the first side;

providing a molding material such that the integrated device die is at least partially embedded in the molding material;

coupling a thermally conductive element to the second side of the integrated device die, at least a portion of the thermally conductive element exposed through the molding material; and removing portions of the molding material to expose the portion of the thermally conductive element and an electrical interconnect structure disposed on the lower side of the substrate.

19. The method of claim 18, wherein the electrical interconnect structure comprises a conductive pillar.

20. The method of claim 18, removing the portions of the molding material comprises exposing protrusions formed on a surface of the thermally conductive element.

* * * * *